United States Patent

Saito et al.

[11] Patent Number: 5,986,458
[45] Date of Patent: Nov. 16, 1999

[54] TEST HEAD FOR SEMICONDUCTOR TESTER

[75] Inventors: Hideki Saito; Kunio Takeuchi; Nobuyuki Yajima; Takeyuki Yanagi, all of Saitama, Japan

[73] Assignee: Advantest Corp., Tokyo, Japan

[21] Appl. No.: 08/875,795

[22] PCT Filed: Feb. 22, 1996

[86] PCT No.: PCT/JP96/00404

§ 371 Date: Jan. 20, 1998

§ 102(e) Date: Jan. 20, 1998

[87] PCT Pub. No.: WO97/27491

PCT Pub. Date: Jul. 31, 1997

[51] Int. Cl.⁶ .................................................. G01R 31/02
[52] U.S. Cl. ........................................ 324/754; 324/158.1
[58] Field of Search ........................... 324/754, 755, 324/756, 758, 762, 158.1

[56] References Cited

U.S. PATENT DOCUMENTS

| | | |
|---|---|---|
| 4,145,620 | 3/1979 | Dice .................................. 324/501 X |
| 4,517,512 | 5/1985 | Petrich et al. ...................... 324/754 X |
| 4,996,478 | 2/1991 | Pope .................................. 324/754 |
| 5,051,689 | 9/1991 | Hiwanda et al. ................... 324/754 |
| 5,747,994 | 5/1998 | Suga ................................... 324/754 X |
| 5,754,057 | 5/1998 | Hama et al. ........................ 324/754 |

*Primary Examiner*—Josie Ballato
*Assistant Examiner*—T. R. Sundaram
*Attorney, Agent, or Firm*—Muramatsu & Associates

[57] ABSTRACT

A test head structure for a semiconductor test system which makes the replacement of pin cards in the test head easy. The test head is formed of a performance board for mounting a semiconductor device to be tested on; a mother board for functioning as an interface for achieving electric connection between the performance board and pin cards; and a back board for supporting and positioning the pin cards in combination with a housing of the test head. The back board is provided in parallel with an upper surface of the housing of the test head by being fixed inside of the housing, wherein the upper surface of the back board is directly attached to the lower surface of the mother board. Pin cards can be accessed to the test head through the bottom of the test head to be connected to or disconnected from the back board through connectors provided on the lower surface of the back board.

4 Claims, 5 Drawing Sheets

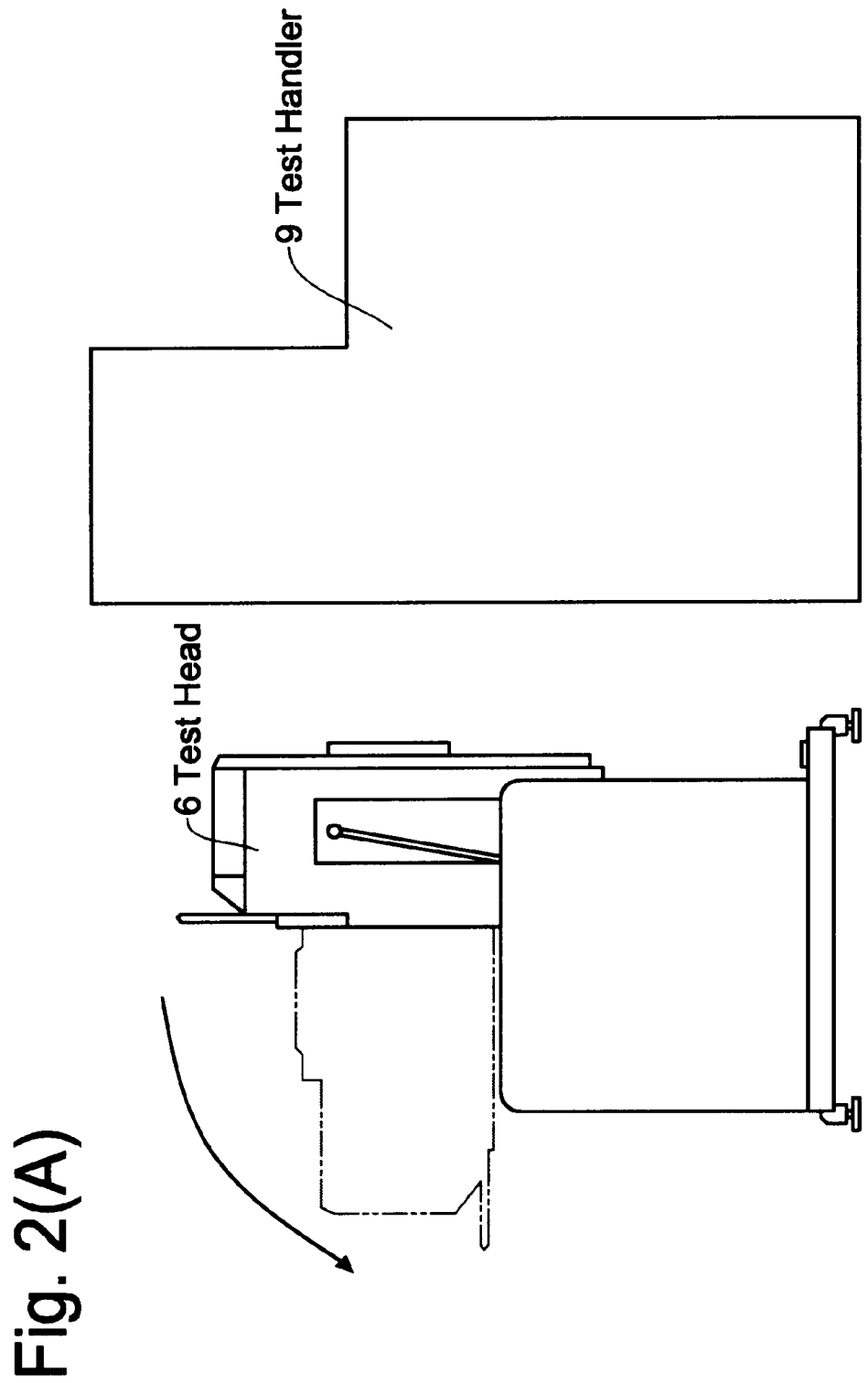

TEST HEAD FOR SEMICONDUCTOR TESTER

FIELD OF THE INVENTION

This invention relates to a test head for testing a semiconductor device by connecting the semiconductor device under test to a semiconductor test system, and more particularly, to a test head which is able to improve efficiency for replacing a pin card which is a printed circuit board mounting various components, and to improve contact reliability of electric connection involved in the test head.

BACKGROUND OF THE INVENTION

FIGS. 3 and 4 show structural examples of a test head used for a semiconductor test system in a conventional technology. In the conventional test head technology for a semiconductor test system, a plurality of printed circuit boards (pin electronics card or pin card) are mounted on a back board for securing a mechanical strength with respect to the test head 6. As shown in the front view of FIG. 3 and in the side view of FIG. 4, a plurality of pin cards 4 are mounted on the back board 1 at the bottom of the test head 6. At the top of the pin cards 4, a mother board 2 is connected to the pin cards 4 through connectors 3. As is known in the art, each of the pin cards 4 includes an electronic component such as a driver, a comparator and switches to provide a test signal to a terminal pin of a device under test. The number of the pin cards 4 corresponds to the maximum number of the terminal pins of a device to be tested.

In general, a semiconductor device to be tested is mounted on a performance board 7. The mother board 2 functions as an interface for electric connection between the performance board 7 and the pin cards 4. Namely, the mother board 2 establishes electronic paths to provide the test signals from the pin cards 4 to the device under test through the performance board 7 as well as the resultant response signals from the device under test to the pin cards 4. The back board 1, in contrast, functions to mechanically support the pin cards 4 in the test head 6 in the accurate positions when the connectors of the pin cards are inserted in the sockets on the back board 1.

In the conventional technology, in order to replace the pin card 4 in the test head 6, the mother board 2 has to be removed from the test head by disconnecting from the connectors 3 which are connected to the pin cards 4.

Recently, the size of the mother board 2 is significantly increased with the increase of functionality of the semiconductor test system. Hence, the mother board 2 can be as large as one square meter and as heavy as 20 kg. When trouble occurs in the pin card 4 or when the pin card is to be replaced because of a model change, for example, the mother board 2 and the pin card 4 must be disconnected to exchange the pin card 4. Because of the size and weight of the mother board as noted above, an operator had to bear a significant burden for such replacement, and thus the efficiency of the replacement is significantly low. Further, the number of pins in each connector 3 to connect between the pin card 4 and the back board 1 or the pin card 4 and the mother board 2 tends to increase with the increase of the scale of the semiconductor test system. Therefore, there is a drawback in the conventional technology that it is necessary to include an additional mechanism for maintaining contact reliability of the electric connection or a mechanism for promoting connection and disconnection of the mother board with less power.

As in the foregoing, in the test head structure of the conventional technology for mounting the pin cards on the boards in the test head, (1) the mother board has to be taken out every time when the pin card must be changed, (2) the work for taking out the mother board is a significant burden for a user due to the size and weight of the mother board, and (3) the additional mechanism for maintaining the contact reliability at the connection area or the mechanism for assisting the connection and disconnection of the mother board with less power is necessary.

SUMMARY OF THE INVENTION

Therefore, it is an object of the present invention to provide a test head structure which can solve the above noted problems involved in the conventional technology. In the test head structure of the present invention for mounting the pin cards on the boards, (1) it is unnecessary to disconnect the mother board every time when replacing the pin card, and (2) it is unnecessary to have the additional mechanism for maintaining the contact reliability at the connection area or the mechanism for assisting the connection and disconnection of the mother board with less power.

In the test head structure of the present invention for mounting the pin cards on the boards in the test head, the back board provided on the bottom side of pin cards opposite to the performance board in the conventional technology is now provided together with the mother board which is in the upper side of the pin cards. The back board is attached to the lower surface of the mother board. As a consequence, since there is no longer a board at the bottom of the test head, the pin cards can be inserted in the connectors provided on the back board in an upward direction from the bottom of the test head.

According to the structure of the present invention, only the pin card that is to be inserted or exchanged is removed without disconnecting the mother board. Thus, the force required to connect/disconnect the pin card is small, and thus the burden for the user to perform such connect and disconnect operations is significantly decreased.

Unlike the conventional structure of piling up various components of the test head from the bottom toward to the top of the test head, the pin cards are provided from the bottom of the test head in the preset invention. This insertion of the pin cards from the bottom of the test head is easily carried out since the test head can usually be rotated 90 degrees or 180 degrees as shown in FIGS. 2(A) and 2(B) when used in combination with other system. FIG. 2(A) shows an example when the test head is connected to a test handler and FIG. 2(B) shows an example when the test head is connected to a wafer prober.

Since the back board is connected to the lower surface of the mother board, the mother board can be smaller than the ones in the conventional technology. In addition, depending on the circuit structure, the back board and the mother board can be integrated into a single back board.

BRIEF DESCRIPTION OF THE DRAWINGS

FIG. 2(A) shows an example of using the test head wherein the test head is connected to a test handler.

DETAILED DESCRIPTION OF THE EMBODIMENTS

Figure 1:
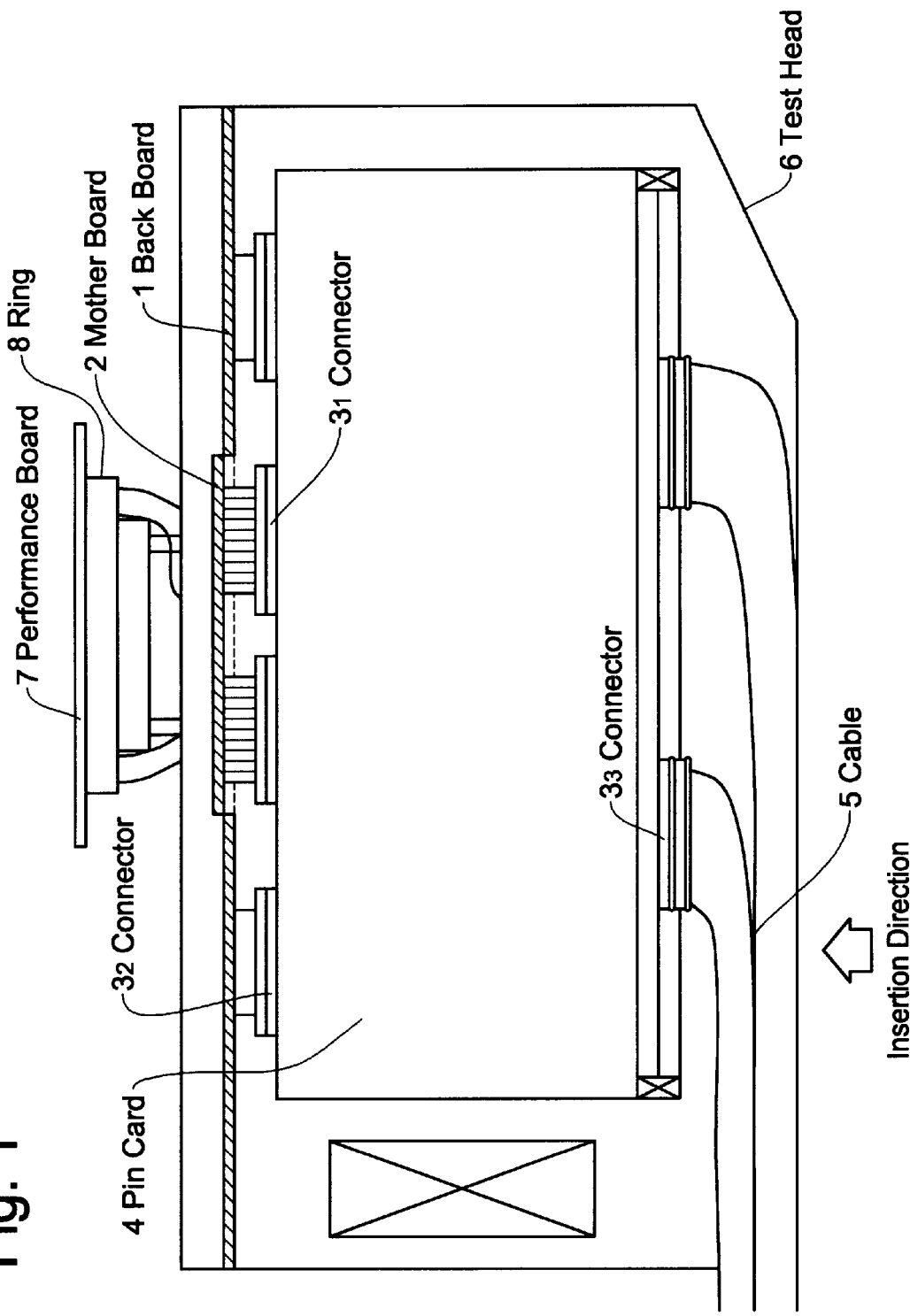
FIG. 1 is a side view showing the concept of an embodiment of the present invention.
Figure 2B:
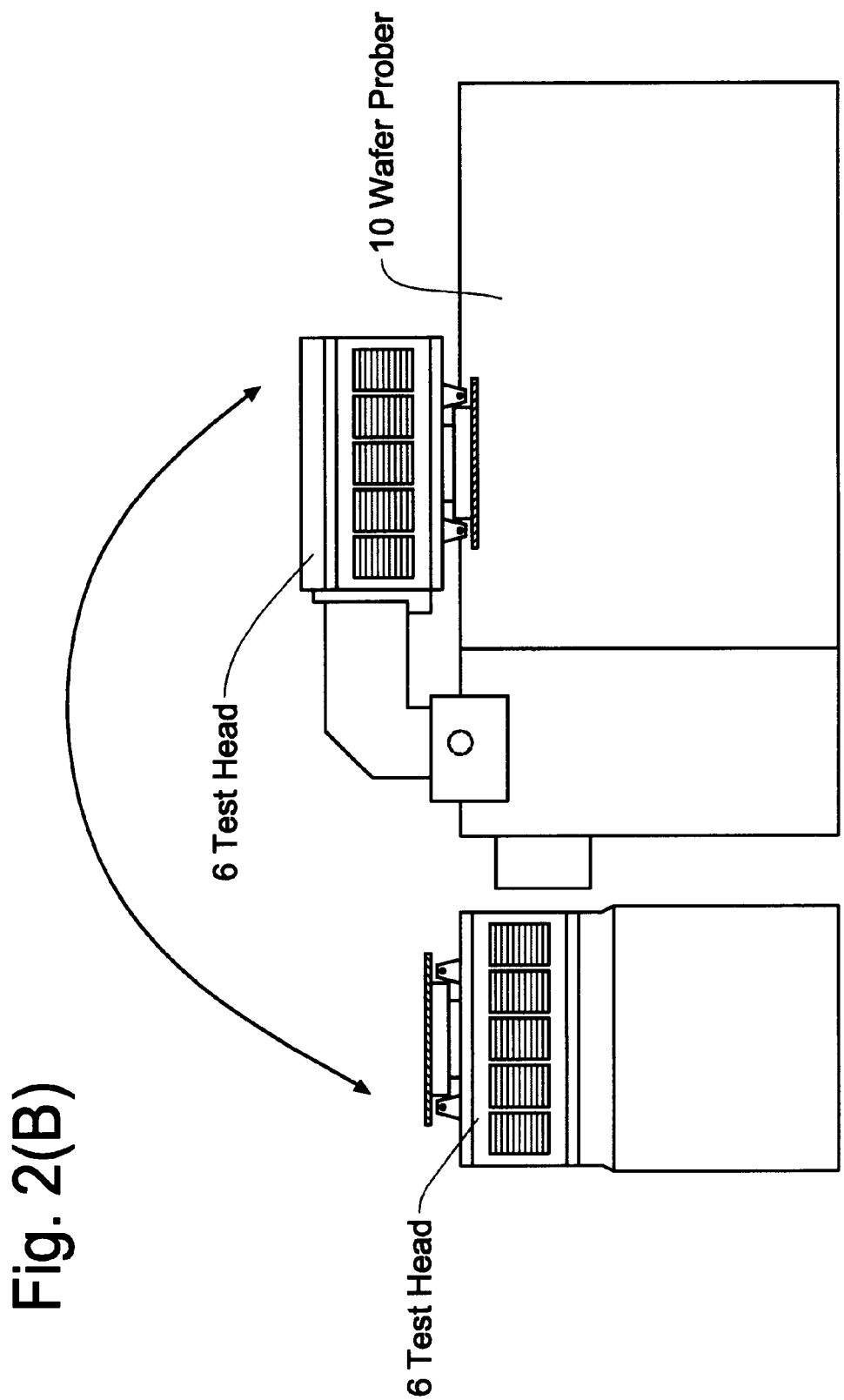
FIG. 2(B) shows an example of using the test head wherein the test head is connected to a wafer prober.

FIGS. 1 and 2 are side views showing the basic structure of the embodiment of the present invention. Within the context of the present invention, the side of the test head structure where the performance board 7 is provided is referred to as an "upper side", while the opposite side of the test head structure is referred to as a "bottom side". As shown in FIG. 1, in the test head structure of the present invention for mounting the pin cards on the boards in the test head, the back board 1 provided on the bottom side of pin cards opposite to the performance board 7 in the conventional technology is now provided together with the mother board 2 which is in the upper side of the pin cards. The back board 1 is attached to the lower surface of the mother board 2. The purposes of the mother board 2 and the back board 1 are the same as in the foregoing described with respect to the conventional technology. A first connector $3_1$ of the pin card 4 is inserted in sockets on the mother board 2 to establish electrical signal paths between the pin card 4 and the mother board 2. Further the pin card 4 can be connected to the back board 1 by pressingly inserting a second connector $3_2$ into the sockets on the back board in an upward direction from the bottom of the test head. The sockets for receiving the the second connector $3_2$ are fixed on the back board 1 and the back board 1 is fixed to the test head. Therefore, the pin cards 4 are fixed in the test head by the back board provided at the upper position of the test head.

At the lower portion of the test head, the third connectors $3_3$ of the pin cards 4 and cables 5 are provided at the bottom ends of the pin cards for input and output of signals.

As shown in FIG. 2, usually, the test head 6 is structured so as to be rotated. Therefore, the test head 6 can be turned upside-down so that the pin cards 4 can be inserted into the test head 6 to mount the pin cards therein from the upper direction with respect to the other devices.

At the upper portion of the test head 6, the performance board 7 and a ring 8 which supports the performance board are provided to form the overall test head.

The electric connection must be established through the mother board 2 between the performance board 7 and the pin cards 4. In the present invention, the size of the mother board 2 can be minimal because mechanical strength is already attained by the back board 1 as noted above.

In addition, the weight of the overall test head and the cost can be reduced since the additional mechanism used in the conventional technology for assisting the connect and disconnect operations of the mother board are no longer necessary.

As a result, the weight of the overall test head 6 can be significantly reduced in the present invention.

In the embodiment described above, the back board 1 and the mother board 2 are separated and are arranged adjacent to each other. However, it is also possible that the mother board 2 can be integrated into the back board 1. In such an arrangement, the present invention can attain the effects similar to the one described above.

Figure 3:
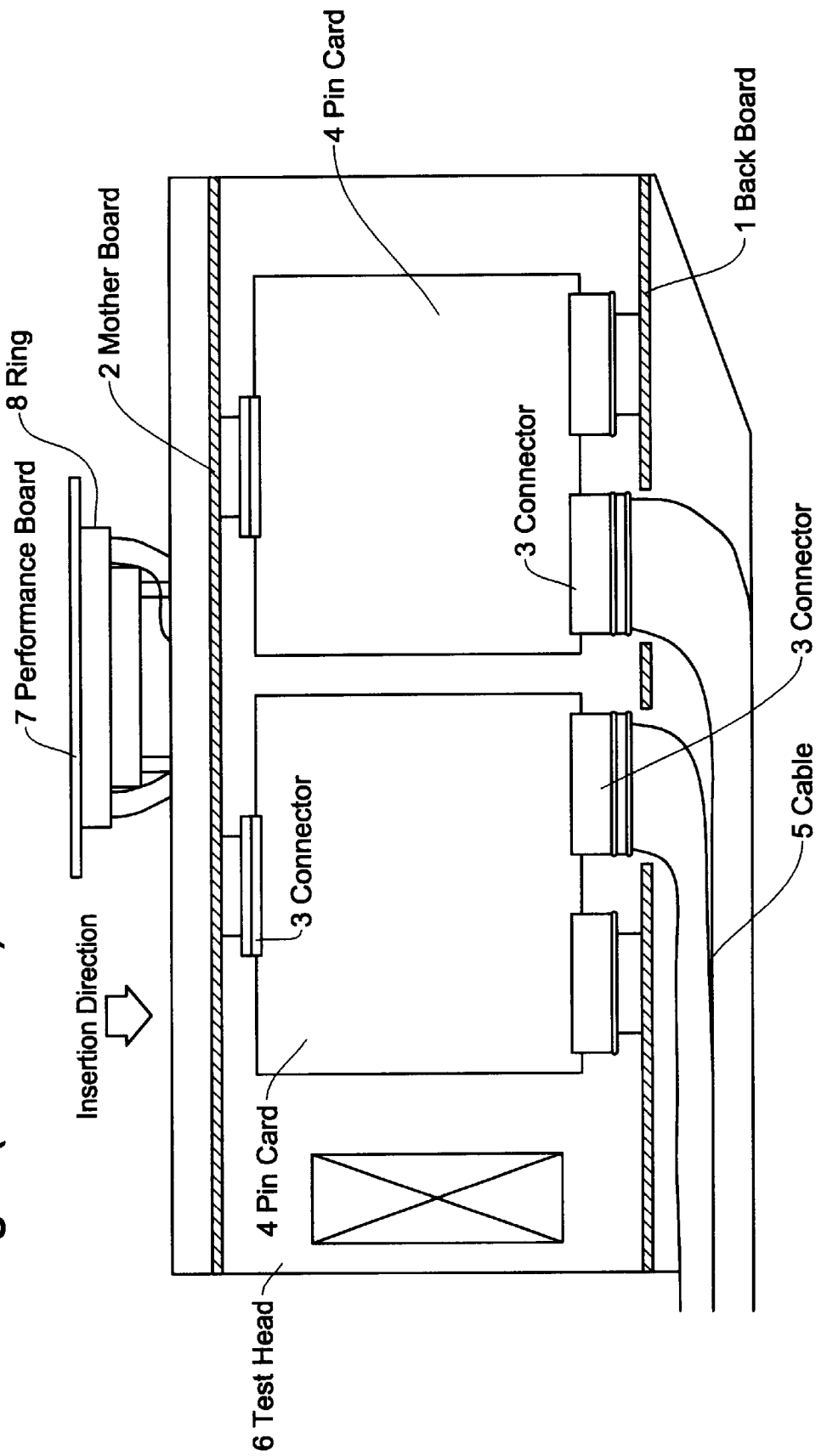
FIG. 3 is a side view showing a structure of a test head in the conventional technology.
Figure 4:
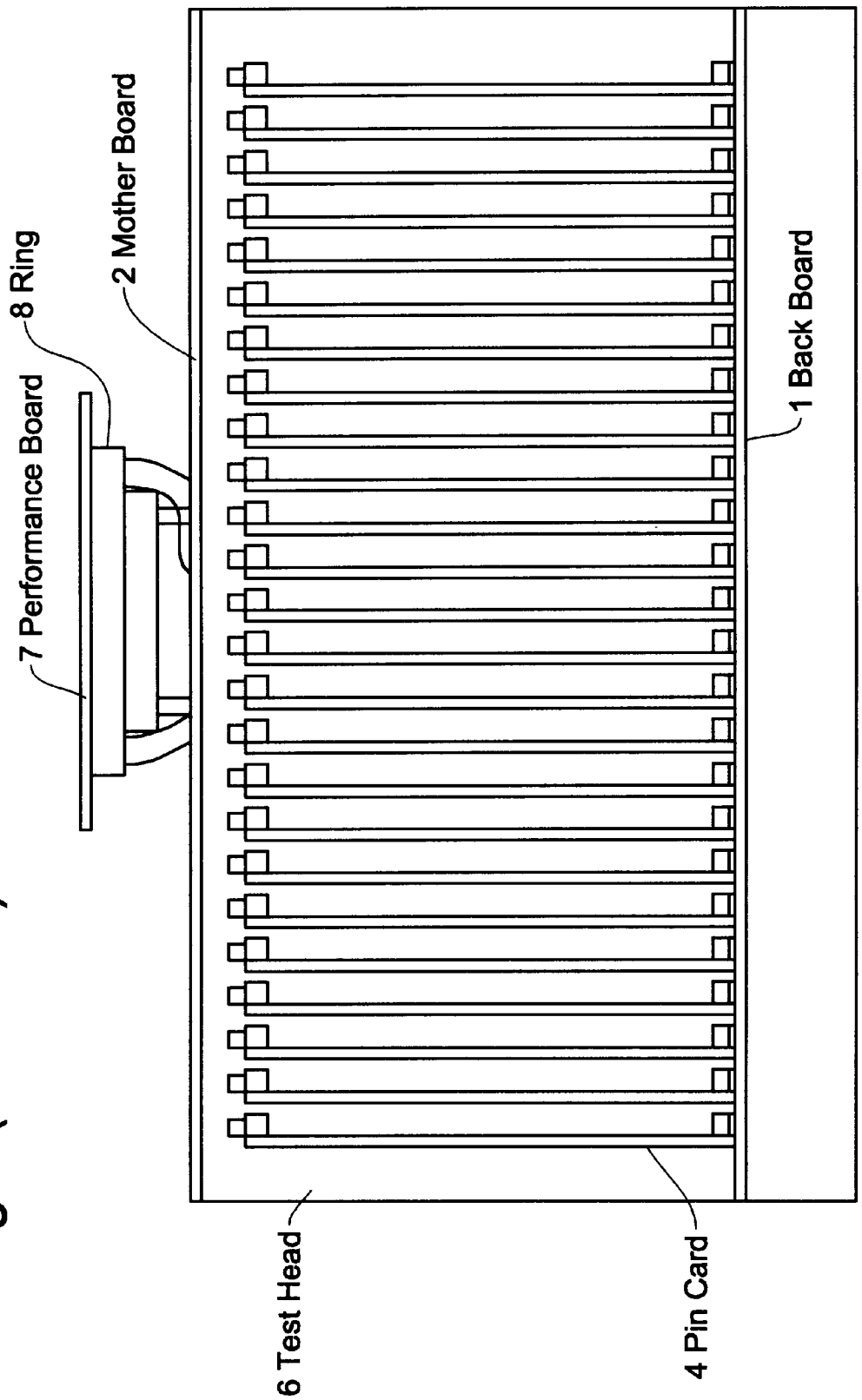
FIG. 4 is a front view showing a structure of a test head in the conventional technology.

The size of the pin card 4 can be arbitrary and be changed by the design choice. The pin card 4 can be arranged in such a way that the pin card is divided into two for one cross section of the test head 6 as shown in FIG. 3. Alternatively, the pin card 4 can be arranged in such a way that the pin card is integrated into one for one cross section of the test head 6.

INDUSTRIAL APPLICABILITY

Since it is configured as described in the foregoing, the present invention has the following effects.

In the operation of changing the pin cards with respect to the boards in the test head of the semiconductor test apparatus, the efficiency of the replacement of the pin cards is significantly improved since the mother board, which has to be disconnected every time when such a replacement is performed in the conventional technology, is no longer necessary to be disconnected in the present invention.

Hence, the cost of the test head as a whole is reduced since the additional mechanism required in the conventional technology for assisting the connect/disconnect operations of the mother board is unnecessary.

According to the test head structure of the present invention for mounting the pin cards on the boards in the test head, only the pin card that is to be replaced has to be disconnected from the test head. Thus, the connection reliability is improved since uncertainty involved in the connection and disconnection of the parts of the test head other than the pin cards will not occur when changing the pin cards, unlike the conventional technology where the mother board has to be disconnected.

What is claimed is:

1. A test head for a semiconductor test system for testing a semiconductor device, comprising:

a housing of the test head arranged in such a way that the test head can be rotated in a vertical plane;

a performance board provided over a first surface of the housing through a support ring for mounting a semiconductor device thereon when testing the semiconductor device (device under test);

a plurality of pin cards provided in the housing, each of the pin cards corresponding to a terminal pin of the device under test and including an electronic circuit for supplying a test signal to the terminal pin of the device under test and receiving a resultant output signal from the device under test;

a mother board attached to the first surface of the housing in parallel for interfacing the performance board and the pin cards so that the test signal and the resultant output signal transmit therethrough, the pin cards having first connectors which are inserted in sockets on the mother board to establish signal paths to the mother board, the support ring being provided between the mother board and the performance board to support the performance board thereon; and a back board attached to the mother board at a surface of the mother board opposite to that having the support ring, the back board being attached to the first surface of the housing in parallel for mechanically supporting and positioning the pin cards in the housing when second connectors of the pin cards being inserted in sockets on the back board;

wherein the pin cards are accessed through a second surface of the housing which is opposite to the first surface of the housing when connecting to or disconnecting from the mother board and the back board.

2. A test head for a semiconductor test system as described in claim 1, wherein the back board is integrally formed with the mother board.

3. A test head for a semiconductor test system as described in claim 1, wherein the pin cards are connected to or disconnected from the mother board and the back board after rotating the test head in a predetermined degree.

4. A test head for a semiconductor test system as described in claim 1, wherein each of the pin cards has third connectors at a side opposite to the side having the first and second connectors for establishing electrical connection with cables connected to a main frame of the semiconductor test system.

* * * * *

UNITED STATES PATENT AND TRADEMARK OFFICE
CERTIFICATE OF CORRECTION

PATENT NO. : 5,986,458
DATED : November 16, 1999
INVENTOR(S) : Hideki Saito et al.

It is certified that error appears in the above-identified patent and that said Letters Patent is hereby corrected as shown below:

ON THE TITLE PAGE:
Item [75] Inventors;
Please change inventor's name from "Nobuyuki Yajima" to
--Nobuaki Yajima--.

Signed and Sealed this

Eleventh Day of July, 2000

*Attest:*

*Attesting Officer*

Q. TODD DICKINSON
*Director of Patents and Trademarks*